United States Patent [19]

Senderowicz et al.

[11] Patent Number: 4,730,168

[45] Date of Patent: Mar. 8, 1988

[54] CMOS OUTPUT STAGE WITH LARGE VOLTAGE SWING AND WITH STABILIZATION OF THE QUIESCENT CURRENT

[75] Inventors: Daniel Senderowicz, Berkeley, Calif.; Germano Nicollini, Piacenza, Italy

[73] Assignee: Sgs Microelettronica SpA, Agrate Brianza, Italy

[21] Appl. No.: 896,205

[22] Filed: Aug. 14, 1986

[30] Foreign Application Priority Data

Sep. 18, 1985 [IT] Italy ............................ 22181 A/85

[51] Int. Cl.$^4$ ............................................ H03F 3/45
[52] U.S. Cl. ......................................... 330/253; 330/255; 330/259; 330/260; 330/311
[58] Field of Search ............... 330/253, 255, 257, 259, 330/260, 261, 311, 264

[56] References Cited

U.S. PATENT DOCUMENTS 4,480,230 10/1984 Brehmer et al. ............... 330/253 X

FOREIGN PATENT DOCUMENTS 116309 9/1981 Japan ............................ 330/253

OTHER PUBLICATIONS

Ahuja et al, "A Programmable CMOS Dual Channel Interface Processor for Telecommunications Applications," *IEEE Journal of Solid-State Circuits*, vol. SC-19, No. 6, Dec. 1984, pp. 892-899.

Primary Examiner—James B. Mullins
Attorney, Agent, or Firm—Wenderoth, Lind & Ponack

[57] ABSTRACT

A CMOS output stage with large voltage swing particularly suited for output buffers in monolithic analog subsystems has two, push-pull connected, complementary MOS transistors and has feedback for improving its swing and linearity characteristics in comparison with those of the output stages without feedback of the prior art and also has sufficient stability characteristics which are re-established by local compensation. Furthermore the quiescent current is stabilized by a dedicated control circuit cooperating with a local feedback circuit.

2 Claims, 10 Drawing Figures

CMOS OUTPUT STAGE WITH LARGE VOLTAGE SWING AND WITH STABILIZATION OF THE QUIESCENT CURRENT

BACKGROUND OF THE INVENTION

1. Field of the Invention

The present invention concerns a CMOS output stage with a large voltage swing and with stabilization of the quiescent current.

The present invention concerns, in general, semiconductor amplifiers of the integrated, that is monolithic, type and more particularly, integrated amplifiers in complementary MOS (briefly CMOS) type devices; that is, in monolithic devices formed on a single chip of semiconductor material, typically silicon, wherein the active elements (diodes, transistors, etc.) are generally unipolar elements, of the surface field effect type and may be of an N channel or P channel type, channel type although it is possible to also form junction type bipolar active elements on the same chip or substrate of semiconductor material in order to satisfy particular circuit requirements. Furthermore, the invention is particularly effective and useful for making analog subsystems in digital integrated circuits, that is, for implementing analog functions in integrated digital devices.

2. Description of the Prior Art

Lately the necessity (or usefulness) of implementing analog and digital subsystems in the same integrated circuit using the same fabrication technology has become evermore frequent. For this reason, the implementation of analog functions in MOS technology (Metal-Oxide-Semiconductor) assumes an ever greater importance and in particular, the development of operational amplifiers made with surface field effect elements has had greatly increased.

The operational amplifier is, in fact, the key element, a real building block, or the majority of the analog systems and its characteristics determine decisively the characteristics of the whole system itself.

The requirements which have to be met when designing an operational amplifier which must be used within a monolithic analog subsystem are far different from those of traditional "self standing" operational amplifiers made with bipolar elements. The main difference rests in the fact that, for the majority of the operational amplifiers of a subsystem, the load to be driven is already defined and often purely capacitive with values of a few picofarad, while the "self standing" operational amplifiers are for more general applications and thence must offer certain characteristics necessarily independent of the type of load which may be capacitive (up to hundreds of picofarads) and/or resistive (down to a minimum of about 1 K$\Omega$).

Moreover, inside a monolithic analog subsystem, only very few operational amplifiers must drive a signal outside the chip, that is outside the integrated circuit, where the capacitive and/or resistive loads may take significant values or be quite variable. These amplifiers are called buffer amplifiers, or simply output buffers. The amplifiers, the outputs of which do not leave the integrated circuit, are called instead internal amplifiers. These two types of operational amplifiers are structurally similar in the sense that both are formed by an input differential stage and by a gain stage (FIGS. 1a and 1b) except that, for the separation or output operational amplifiers (buffers) it is necessary to also provide a buffer stage, called an output stage, which permits driving heavy external loads without degrading the gain or the stability of the first two stages (FIG. 1b).

Dynamic characteristics (transient response, bandwidth, settling time) are determined exclusively by the first two stages, that is, the input stage and the gain stage, which together form what is commonly indicated by the term "core"; therefore it is necessary that the output stage have a wide bandwidth with respect to the core and that it introduce a phase shift of only few degrees at the open loop cut-off frequency of the core in order not to degrade the dynamic performances of the whole operational amplifier.

Other requirements of the output stage are a low output impedance (much smaller of that of the load), a large maximum swing of the output signal, that is, a high peak value of the output voltage before clipping begins to take place, and the ability to supply a high current to the load with relatively low total harmonic distortion, that is, a high linearity. These last two characteristics are typical of power stages.

Frequently, a source follower is used as the output stage, that is, a stage formed by two P-channel or N-channel MOS transistors in a common drain configuration, which provides a voltage gain lower than unity and a large current gain (FIG. 2).

An output stage of this type is characterized by an extremely wide bandwidth and introduces a negligible phase shift at the open loop cut-off frequency of the operational amplifier. On the other hand, it presents some important drawbacks; namely:

(a) the voltage excursion on the load, positive in the case of a source follower stage made with N channel devices or negative in the case of a source follower stage made with P-channel devices, are limited by a sum of intrinsic characteristics of the two integrated MOS transistors, that is, by the value of the cut-in threshold voltage, by the body effect, and by the overdriving;

(b) a limited ability of absorbing current from the current generator M2 (FIG. 2).

With the aim of overcoming the first drawback, it has been proposed to use an emitter follower output stage utilizing a junction type bipolar transistor Q1 in place of the MOS transistor (FIG. 3), that is, purposely forming a bipolar transistor of the junction type on the same CMOS chip, which is an already consolidated technique that does not require additional masks beside those normally used by the CMOS process.

However, this solution has a drawback too; namely:

(i) a persistent limited capability of absorbing current from the current generator M2;

(ii) the risk of degrading the gain of the preceding stage (operational amplifier) if $\beta_{Q1}$ is not very high because the impedance seen from the base of Q1 approximately equals the product $\beta_{Q1}R_L$, where $R_L$ is the external load, and the possibility of encountering stability problems due to the low and hardly controllable cut-off frequency ($f_T$) of the bipolar transistor Q1;

(iii) the possibility of establishing a parasitic SCR (latch-up) caused by the collector current flowing through the substrate of the integrated circuit.

Another widely used solution is the class-AB output stage (FIG. 4). The characteristics of this stage are practically very similar to those of the simple source follower stage though not presenting limitations on the capability of absorbing or delivering current, respectively, from or to the load; nevertheless, this output stage presents the drawbacks of an output impedance which is relatively high with respect to the load and of a maximum excursion of the output signal is limited both towards the voltage $V_{DD}$ as well as towards voltage $V_{SS}$.

SUMMARY OF THE INVENTION

It is a main objective of the present invention to provide a CMOS output stage that does not present the above mentioned drawbacks typical of the output stages of the known techniques.

The output stage of the present invention, contrary to the known output stages, adopts local feedback for enhancing the characteristics of maximum swing of the output signal and of linearity, while providing local compensation to the output stage for restoring, in a proper measure, the stability characteristics impaired by the introduction of the feedback. An additional characteristic of the output stage of the present invention is the stabilization of the quiescent current, that is, of the current drawn by the output stage in the absence of a signal at the input of the operational amplifier, by means of a particular control circuit which, in cooperation with the local feedback, also allows the stabilization of the rest quiescent current in the presence of considerable unbalances of an intrinsic nature or due to other accidental causes.

Essentially the CMOS output stage comprises two, push-pull connected, complementary MOS output transistors, whose capacity for delivering or drawing current from the load is controlled, respectively, by two feedback paths in parallel, each one of which is constituted by an amplifier formed by a differential input stage and by a gain stage, compensated so as to insure stability of the whole output stage without degrading the passband and the phase shift of the core of the operational amplifier in any condition of temperature, manufacturing process and load foreseeable for the circuit.

Preferably, the input differential stage is unified and is shared by the two gain stages of the two feedback paths in parallel.

BRIEF DESCRIPTION OF THE DRAWINGS

FIGS. 1a and 1b, to which reference has already been made in connection of the description of the prior art relative to the present invention, represent, schematically, the two types of monolithic operational amplifiers mentioned above and commonly used in analog subsystems.

FIGS. 2, 3 and 4 show output stages representative of the prior art described before in connection with the discussion of the prior art and of its drawbacks.

The $V_{BIAS}$ in all figures, and where not indicated otherwise, always represents a fixed biasing voltage, usually obtained from extremely stable sources substantially insensitive to perturbing factors and which are normally present on the integrated circuit chip itself. Symbols and notations used in all figures are those normally used in specific technical literature and, where not expressly recalled in the present description, they are believed to be easily understood by one versed in this field of technology.

DESCRIPTION OF THE PREFERRED EMBODIMENTS

Figure 5:
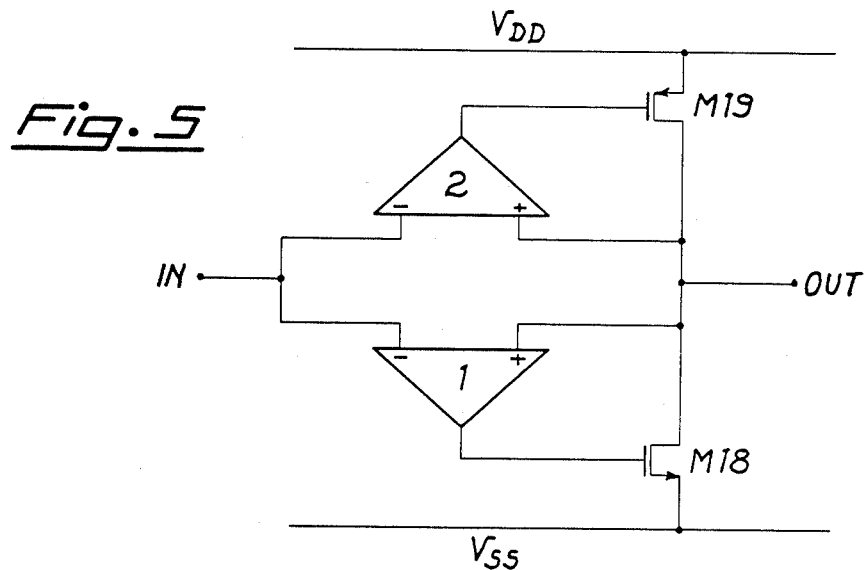
FIG. 5 is a diagram of an output stage in accordance with the present invention.

As it may be observed in FIG. 5, the two complementary MOS transistors M18 and M19, connected in a push-pull circuit, are controlled by the respective feedback loops utilizing differential amplifiers 1 and 2.

As it can already be observed, the voltage gain of the output stage is lower than unity, being the output signal fed back to the non-inverting input of the differential input circuit of each of the two feedback amplifiers 1 and 2.

Figure 6:
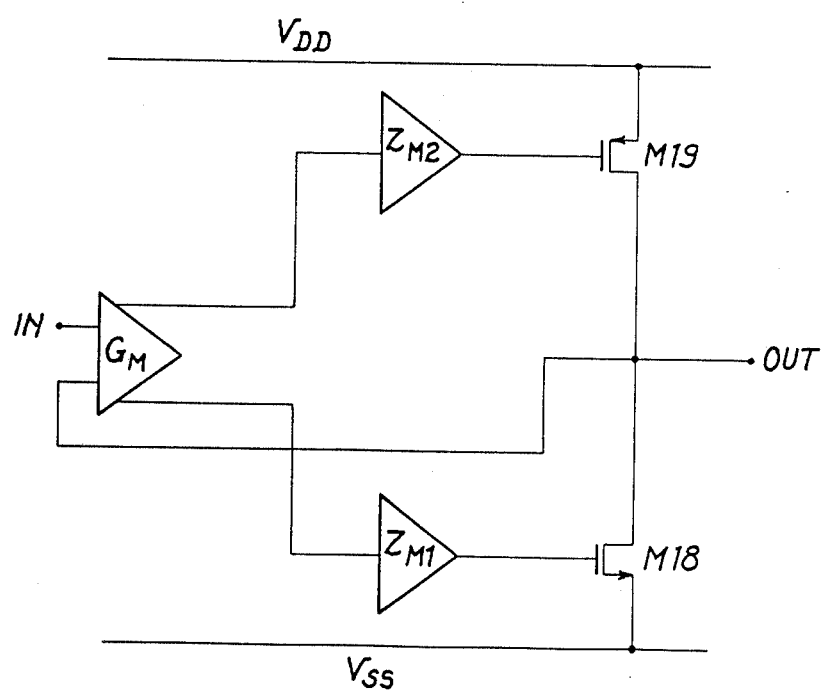
FIG. 6 is a diagram of a preferred embodiment of an output stage in accordance with the present invention.

For reasons of greater practicality, the input differential stage of the reaction amplifiers 1 and 2 of FIG. 5 may also be formed by a single input transconductance differential stage $G_M$ serving two successive separate transresistance stages $Z_{M1}$ and $Z_{M2}$ as schematically shown in FIG. 6.

Figure 1A:
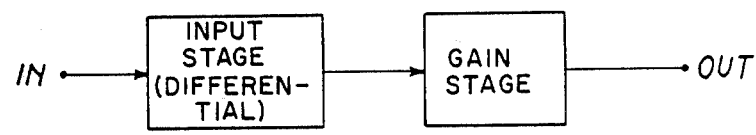
FIGS. 1a and 1b are block diagrams representing respectively internal operational amplifiers and buffer operational amplifiers (output buffers)
Figure 1B:
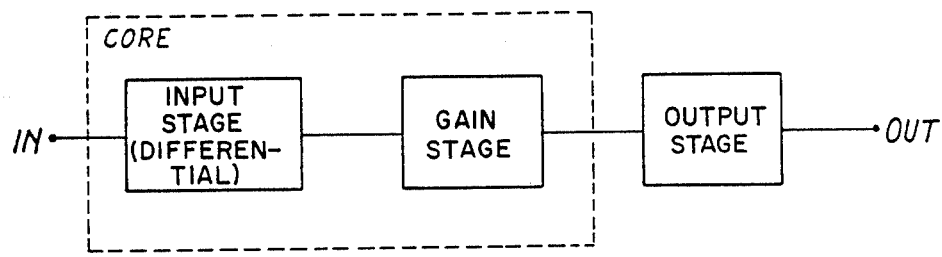
Figure 2:
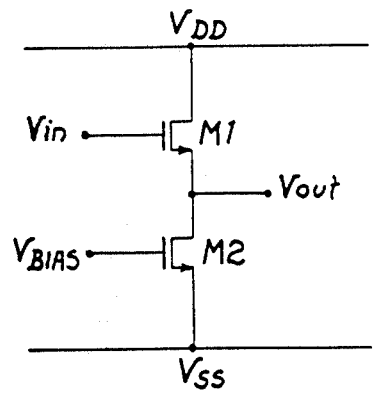
FIG. 2 is a diagram of a known source follower output stage.
Figure 3:
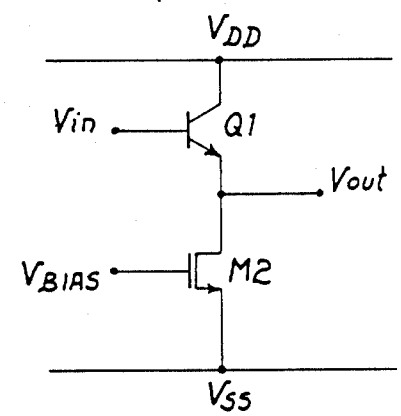
FIG. 3 is a diagram of another output stage of a known emitter follower type.
Figure 4:
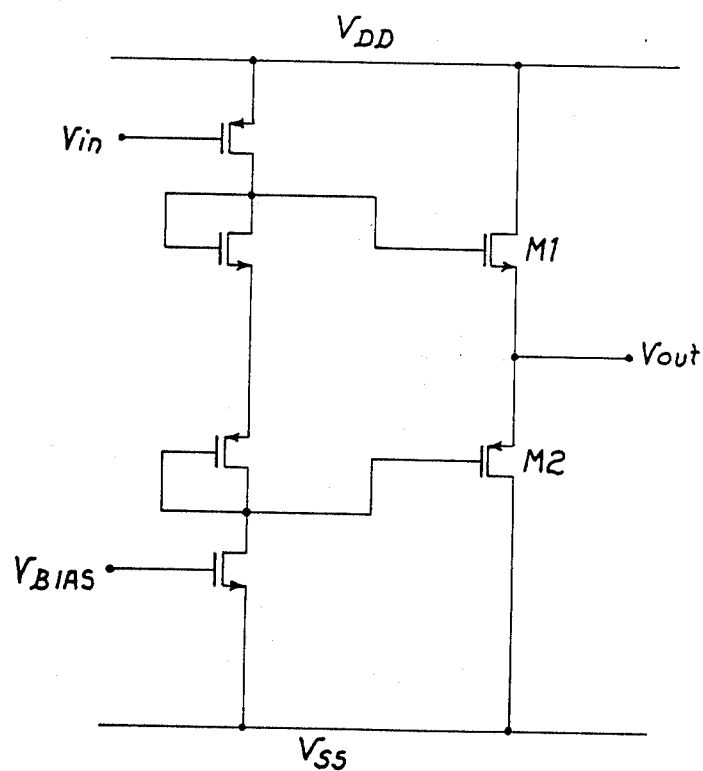
FIG. 4 is a diagram of another output stage of a known class AB push-pull type.

The output stage of the invention, as schematically illustrated in FIG. 5 or 6, offers the following advantages with respect to the output stages of the prior art exemplified in FIGS. 2, 3 and 4:

a large maximum swing of the output signal which may reach the levels of the respective supply voltages $V_{DD}$ and $V_{SS}$;

no limitation of the current supply to the load because the $V_{GS}$ (voltages between gate and source) of M18 and M19 may have ample excursions;

no degradation of the characteristics of the core of the operational amplifier because the input impedance is theoretically infinite;

a relatively low output impedance, because the open loop resistance is divided by the sum of the loop gains of the local feedback paths formed by the two amplifiers 1 and 2 (FIG. 5), or $G_M Z_{M2}$ and $G_M Z_{M1}$ (FIG. 6), respectively, with the gains of transistors M18 and M19, from which it follows that the output impedance of this stage is on the order of tens of ohms.

As already said before, compensation of the amplifiers 1 and 2, or of the amplifiers $Z_{M2}$ and $Z_{M1}$, must be so as to insure stability of the whole output stage and, at the same time, not to degrade the passband and the phase shift of the core of the operational amplifier in all conditions of temperature, process and load in which the circuit must function.

Figure 7:
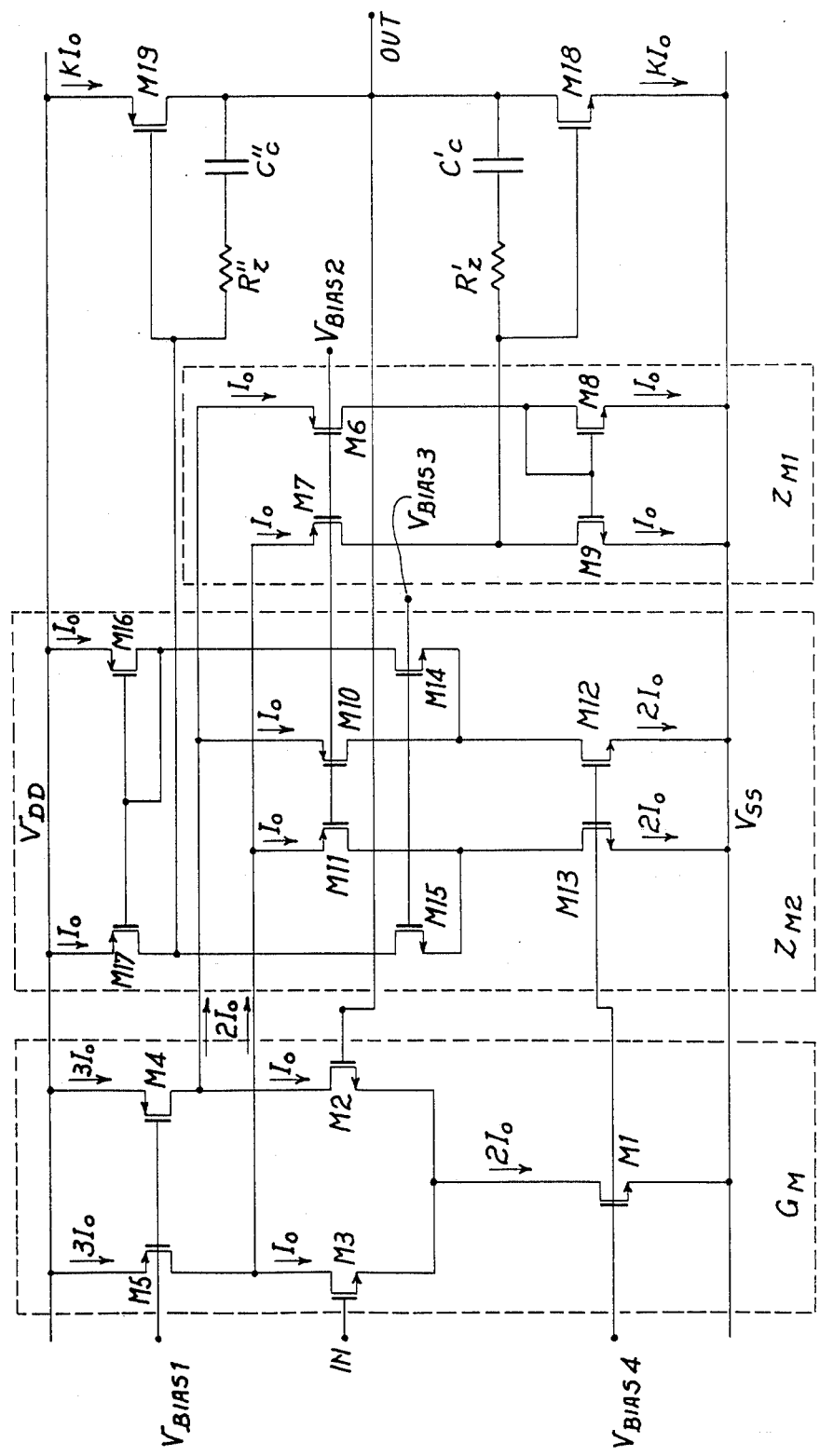
FIG. 7 is a diagram, more in detail, of the output stage of FIG. 6.

Therefore, according to a preferred embodiment of the invention, schematically shown in the preceding FIG. 6, a practical example of the output stage is shown in FIG. 7.

$V_{BIAS1}$, $V_{BIAS2}$, $V_{BIAS3}$ and $V_{BIAS4}$ are bias voltages of the transistors in the output stage and are generated by a bias circuit present in the integrated circuit itself.

The input differential stage $G_M$ is composed of the current generator ($2I_O$) M1, of the current generators ($3I_O$) M5 and M4, and of transistors M3 and M2, the gates of which constitute two inputs of the differential stage which is "shared" by the two gain amplifiers $Z_{M1}$ and $Z_{M2}$ formed, respectively, of transistors M6, M7, M8 and M9 and of transistors M14, M15, M16 and M17. Transistors M10, M11, M12 and M13, form a translation circuit of the basic bias current $I_O$. The compensation necessary for restoring the characteristics of dynamic stability is implemented, respectively, by $C_c'$ and by $R_z'$ as far as the "lower portion" is concerned, that is, for the negative excursions of the output voltage, and by $C_c''$ and $R_z''$ as far as the "top portion" is concerned, that is, for the positive excursions of the output voltage.

In the absence of an input signal, the condition of the currents (which are defined to be the rest or quiescent currents) in the different branches of the circuit is shown in FIG. 7. These currents are all multiples of a basic unit current $I_O$ set by a generator and then mirrored into the output stage. The choice of $I_O$ is a compromise between stability requirements (the greater $I_O$, the more stable the circuit results for the same conditions) and of dissipated power. The two output transistors M18 and M19 will have a rest current $kI_O$, where k has a value on the order of tens, for example, about 40.

In the presence of an input signal, the differential stage $G_M$ determines an unbalance of the currents in transistors M2 and M3 which reflects itself as a variation in a sense (i.e. increase) of $V_{GS}$ of the output transistor M18 and in the opposite sense (i.e. decrease) of $V_{GS}$ of the transistor M19, which means that one of the two tends to supply much more current with respect to the rest current $kI_O$ while the other tends to cut-off.

Therefore, this current is supplied to the load across which a voltage is developed and thence power until reaching an equilibrium position, due to the presence of the local feedback (short circuit between output and the other input of the differential stage), equal to the input voltage ($V_{IN}$) itself.

Obviously, in order that the output voltage may have ample excursions, it is necessary that the output transistors M18 and M19 have a good intrinsic capacity of supplying current to the load in the presence of a signal, which means that, wishing to use reasonable dimensions, it is necessary to provide, during the design stage, the possibility of being able to quickly decrease the voltage supplied to the gate of transistor M19 and to quickly increase the voltage supplied to the gate of transistor M18.

The bias voltages ($V_{BIAS1}$ . . . $V_{BIAS4}$), besides fixing the rest currents of the circuit are suitably choosen together with proper sizing of the relevant transistors, to permit large excursions of the voltage between gate and source ($V_{GS}$) of transistors M18 and M19.

The output stage of FIG. 7, though offering the above mentioned advantages with respect to the output stages of the prior art and though properly compensated, by means of the two RC circuits on both branches, with respect to the dynamic characteristics of the output stage, could, upon occurence of particular circumstances, develop a difference in the level of the rest current with respect to the optimal value $kI_O$ attributed to it by the circuit of the output stage as described before.

For example, unbalance conditions could take place in the two pairs of identical transistors M8 and M9 and M16 and M17. Supposing in fact that there is an unbalance between M8 and M9 such that, in the absence of an input signal, the gate of M18 is at a greater potential than the foreseen value, for example, identical to that of the drain of M8, such a circumstance would produce a strong increase of the current through M18 with respect to the set value $kI_O$. If then, and simultaneously with that, there also exists an unbalance in the pair of transistors M16 and M17 such that the gate of M19 is at a lower potential with respect to the foreseen value, for example, identical to that of the drain of M16, that produces, in turn, a strong increase of the current through M19 with respect to the set value $kI_O$. The output voltage $V_{OUT}$ across the load is, however, substantially insensitive to the simultaneous increase of the rest current through both branches of the output stage; thus, the local feedback cannot counter-balance such an increase with the consequence of an unchecked increase in the power dissipation.

Obviously, the opposite situation may also take place and that, because of concurrent unbalances, a decrease of the rest current with respect to the set value $kI_O$ be observed with consequent problems of instability.

Figure 8:
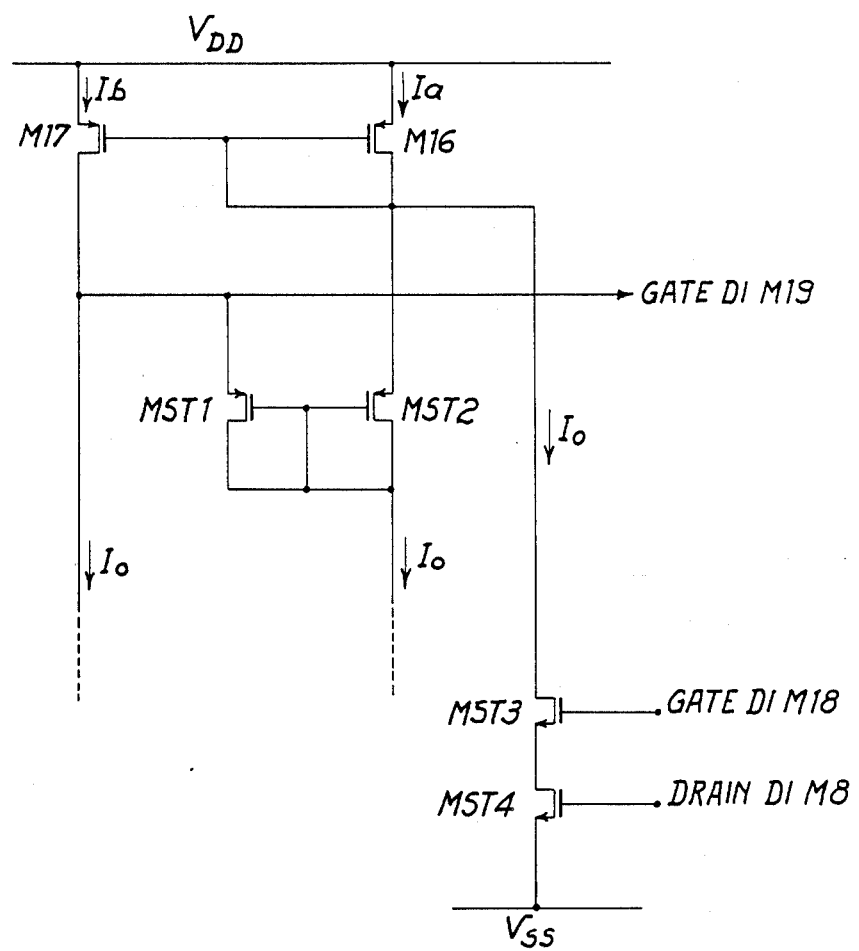
FIG. 8 is a diagram of a control circuit for controlling the rest current of an output stage in accordance with the present invention.

Therefore, with the aim of stabilizing the output rest current and thence insuring stability of the stage, a particularly preferred embodiment of the output stage of the invention comprises a special control circuit capable of detecting eventual unbalance conditions and of re-establishing the correct conditions. The control circuit is shown in the diagram of FIG. 8. The control circuit is constituted by transistors MST1, MST2, MST3 and MST4 connected as shown in FIG. 8. If the voltage of the gate of M18 is identical to the voltage of the drain of M8, then the series combination of transistors MST3 and MST4 behaves as a single transistor of double length and, if suitably sized, then it will generate a current equal to $I_O$. Transistors MST1 and MST2 "carry" a current equal to $I_O/2$ when their respective sources are at the same potential.

Therefore, since $I_a = I_O + I_O/2$ and $I_b = I_O + I_O/2$, a current $kI_O$ is confirmed at the output appropriately reducing the width of M19 in order to compensate for the increase of the voltage between gate and source of M19 due to the fact that a larger current flows through M16 and M17 and thence decreases the rest value of the drain of M17.

Supposing now that there is an unbalance, for example, between M8 and M9 so that the gate of M18 is at a greater potential than, that of the drain of M8; then the current in MST3 and MST4 increases since it is fixed ultimately only by MST4 and ultimately it doubles with respect to that generated in the absence of an unbalance. Consequently, $I_a$ increases; $I_a$ mirrored in $I_b$ determines the increase of the gate potential of M19 and reduces the current therethrough to a value lower than the set value $kI_O$. In this way, in the presence of an unbalance, the output rest voltage tends to decrease and the local feedback, "sensing" the output voltage, intervenes in such a way as to re-balance the currents flowing through M18 and M19 bringing the gate potential of M18 to the same potential of the drain of M8, thus reestablishing the equilibrium conditions.

Figure 9:
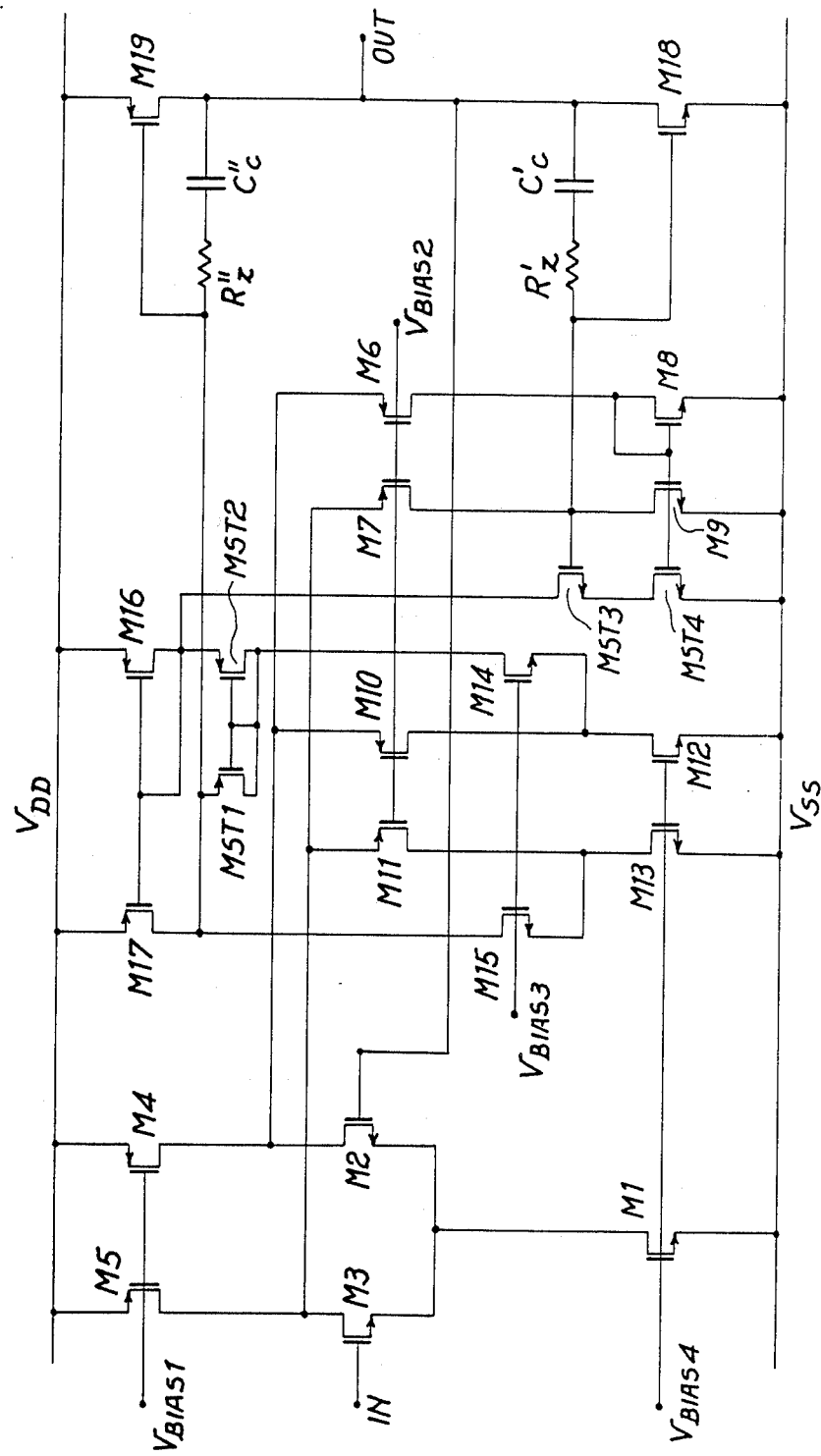
FIG. 9 is the diagram of the output stage of FIG. 7, further incorporating the control circuit of FIG. 8.

A complete diagram of the output stage of the invention incorporating the control circuit of the rest current, evidenced in FIG. 8, is illustrated in FIG. 9.

The control circuit of the rest current allows limiting the power dissipation in the output stage in the presence of unbalances which normally take place and which are due, to a large measure, to hardly controllable parameters and mismatches typical of the fabrication process of the MOS devices, within ±10% of the power dissipation in the absence of said typical unbalances. By comparison, the variation of the power dissipation under rest conditions and in presence of typical unbalances due to the limitations of the process of fabrication and in absence of the stabilization circuit could easily reach even ±500% of the power dissipation under rest conditions.

A characteristic of the control circuit rests in the fact that it intervenes only and exclusively in the absence of an input signal; in fact, the presence of a signal at the input of the output stage is such as to deactivate the stabilization loop, thereby allowing the output stage to develop all of the voltage present at the input over the load.

Obviously the stage shown in relation to the diagrams of FIGS. 7, 8 and 9 and made with N-channel transistors may also be made with P-channel transistors by inverting the transistors and suitably varying their dimensions.

The output stage (output buffer) of the present invention is characterized by an extremely low output impedance (on the order of few tens of ohms). It is capable of satisfactorily driving loads having a capacitance up to about 100 pF and having an impedance which may be only 300 ohms or even lower.

In general, although the invention has been described with reference to a particular preferred embodiment thereof, it is intended that the invention should not be considered limited to such an example, and a expert in the field can easily recognize various possible alternatives and modifications of the illustrative diagrams herein without departing from the scope of the present invention.

What we claim is:

1. A large swing CMOS output buffer, for producing an amplified output signal at an output terminal thereof in accordance with a signal supplied to an input terminal thereof, said buffer comprising:

a pair of push-pull, common-drain connected, complementary output MOS transistors, said common-drain node of said pair of output transistors constituting said output terminal of said buffer;

an input differential stage, having a first input constituting said input terminal of the buffer and having a second input connected to said output terminal of said buffer for providing a direct negative feedback path, said input stage producing output signals at differential stage output terminals in accordance with said signal supplied to said input terminal;

two parallel gain stages, each having two differential input terminals respectively coupled to said differential stage output terminals for producing an output signal at a respective gain stage output terminal in accordance with said output signals of said input differential stage;

said output terminals of said two parallel gain stages being connected, respectively, to the gate of one of said two complementary output MOS transistors forming said push-pull pair and, through a local compensation network comprising a resistor and a capacitor connected in series, to said output terminal of said buffer;

said input differential stage, said two parallel gain stages and said direct connection of said buffer's output terminal to said second input of said input differential stage constituting two parallel feedback loops each providing a direct negative feedback for driving one of said two complementary output transistors.

2. An output buffer as recited in claim 1, further comprising a control circuit for controlling a rest current passing through said pair of output MOS transistors, said control circuit being sensitive to unbalances in rest potentials of said gain stages and capable of determining a shift in a voltage of said buffer's output terminal from its rest value in accordance with such detected unbalances in said rest potentials, such a voltage shift being counterbalanced by said negative feedback loops so as to nullify an effect of said unbalances.

* * * * *